United States Patent [19]

Nakao et al.

[11] Patent Number: 5,455,795
[45] Date of Patent: Oct. 3, 1995

[54] SEMICONDUCTOR MEMORY DEVICE

[75] Inventors: Kouji Nakao, Yokohama; Shigeto Mizukami, Kawasaki, both of Japan

[73] Assignee: Kabushiki Kaisha Toshiba, Kawasaki, Japan

[21] Appl. No.: 341,418

[22] Filed: Nov. 17, 1994

[30] Foreign Application Priority Data

Dec. 3, 1993 [JP] Japan .................................... 5-303597
Aug. 18, 1994 [JP] Japan .................................... 6-194012

[51] Int. Cl.$^6$ .............................................. G11C 13/00
[52] U.S. Cl. ................................................ 365/189.05
[58] Field of Search .................. 365/189.01, 189.04, 365/189.05, 230.08

[56] References Cited

U.S. PATENT DOCUMENTS 5,383,155  1/1995  Ta .................................. 365/189.05

OTHER PUBLICATIONS

Shigeyoshi Watanabe, et al., "An Experimental 16mb CMOS DRAM Chip with a 100 MHz Serial Read/Write Mode" 1988 IEEE International Solid-State Circuits Conference.

Primary Examiner—Terrell W. Fears
Attorney, Agent, or Firm—Spensley, Horn Jubas & Lubitz

[57] ABSTRACT

A semiconductor memory device comprises a page access mode, a plurality of sense amplifiers for detecting data read from a plurality of memory cells selected based on first address inputs A2 to An, a plurality of latch circuits for latching data from the plurality of sense amplifiers, a reading circuit for reading latch data based on second address inputs A0 and A1 corresponding to the plurality of latch circuits, and a control circuit for controlling the sense amplifier to be activated when only the first address input or both first and second address inputs are changed, and to be inactivated when only the second address input is changed.

8 Claims, 9 Drawing Sheets

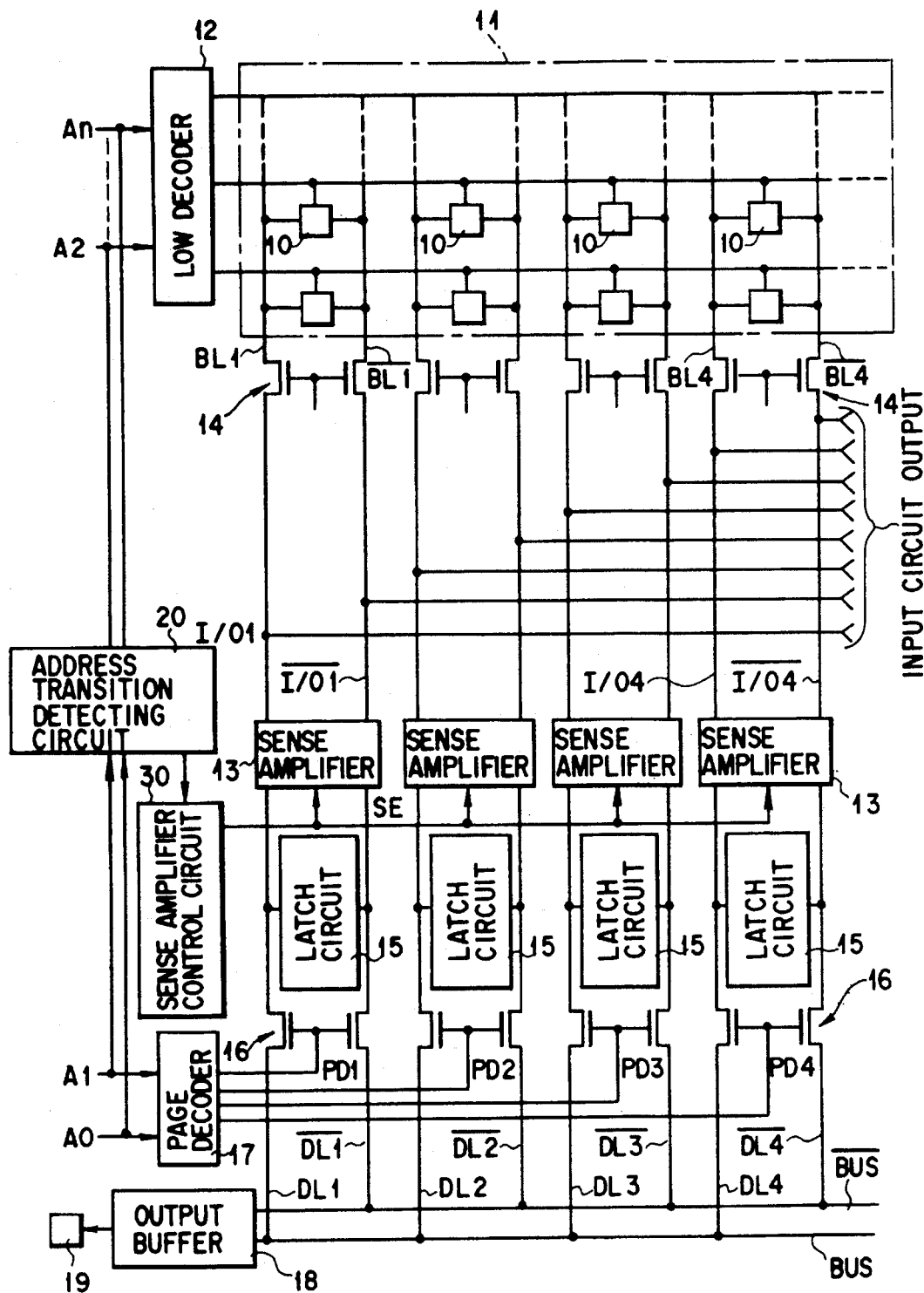
F I G. 2

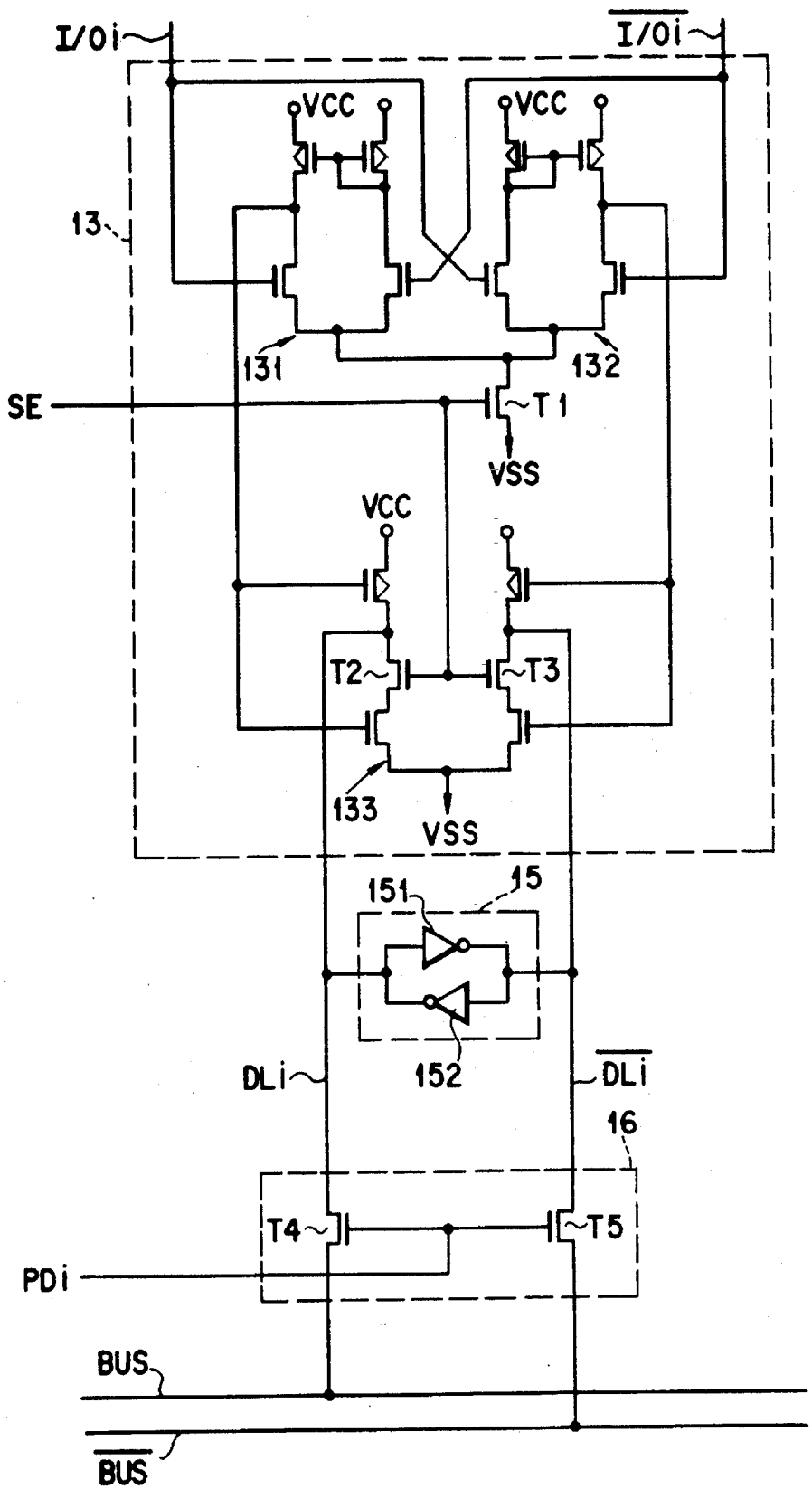
F I G. 3

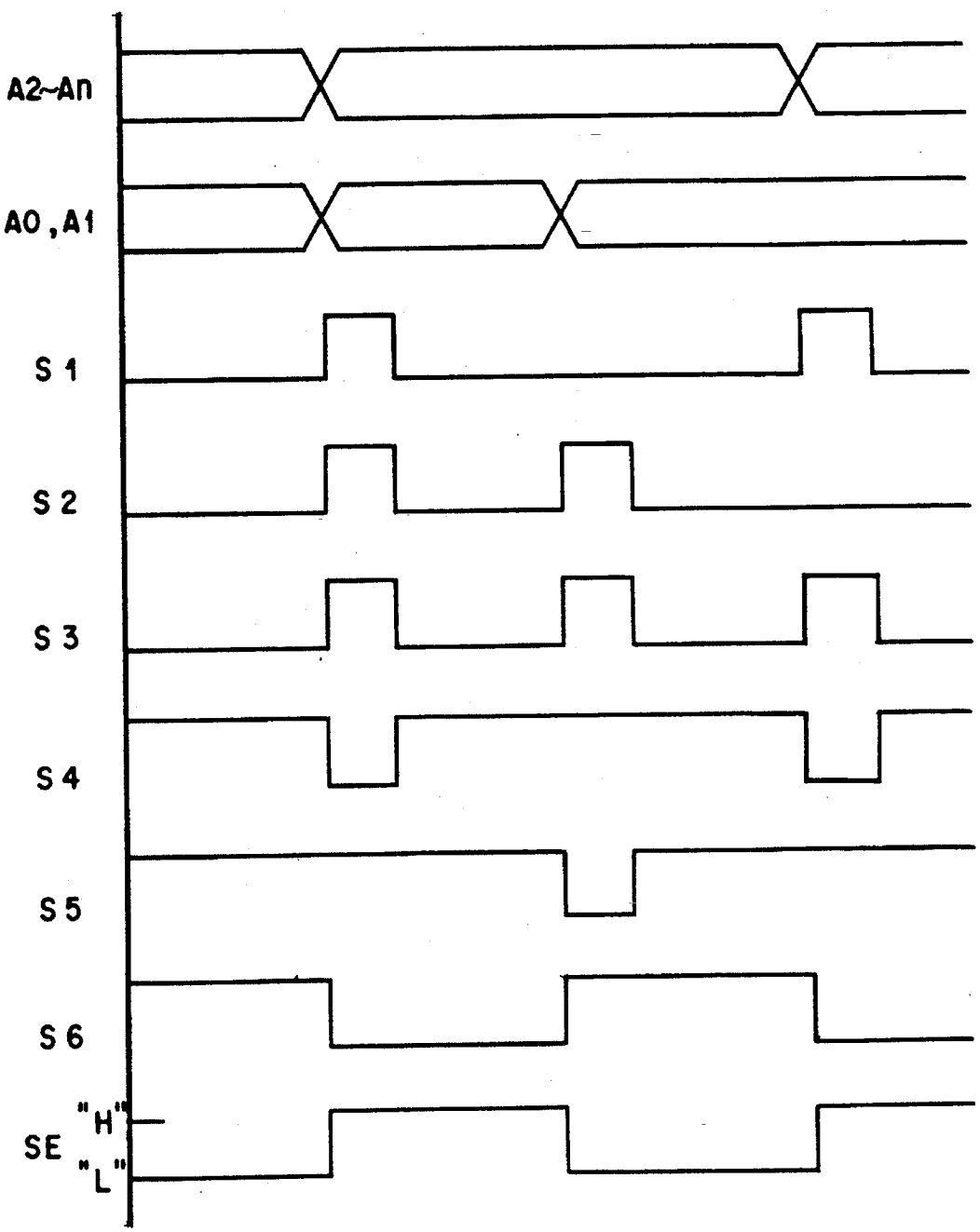
F I G. 5

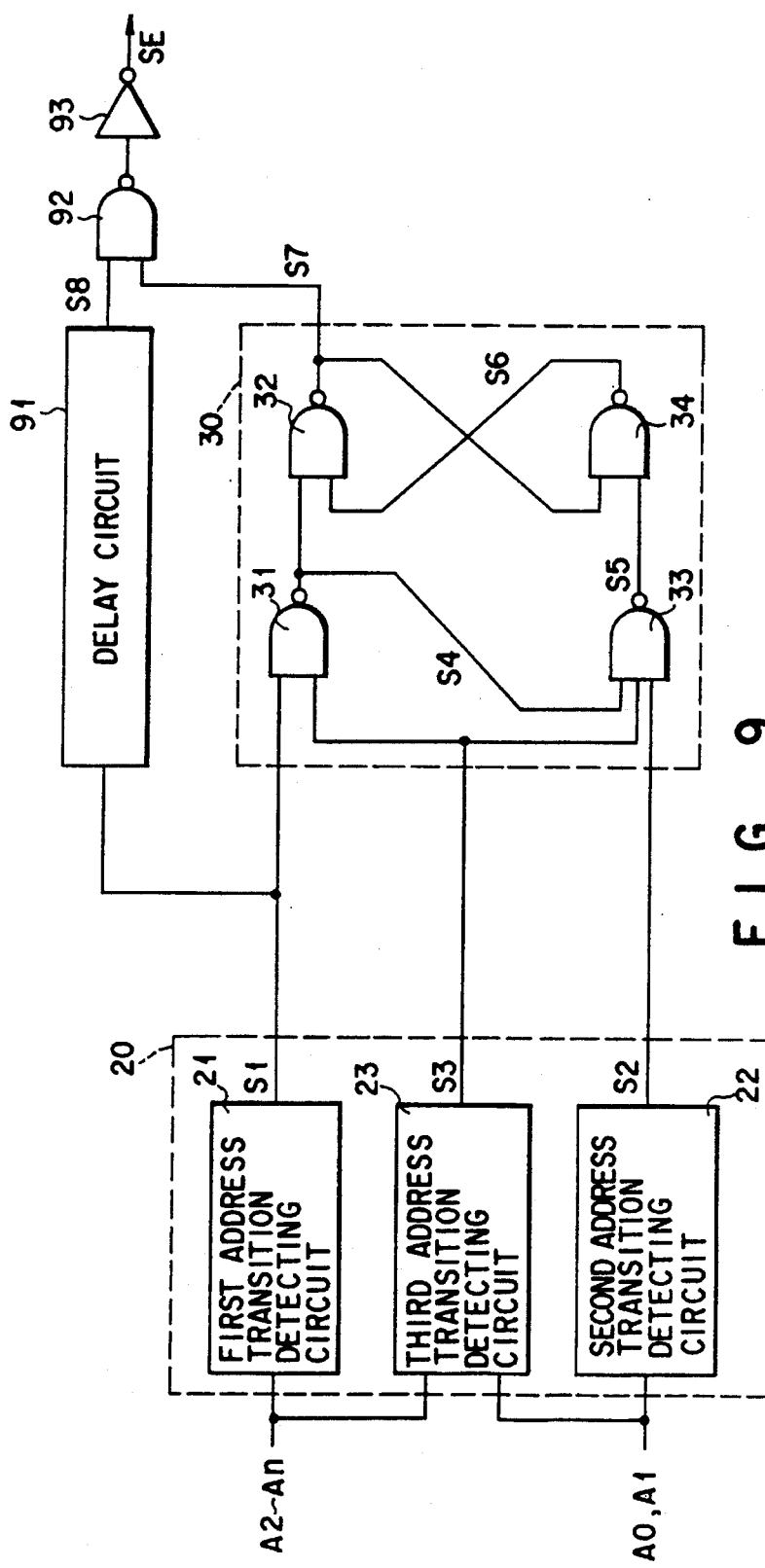
F I G. 9
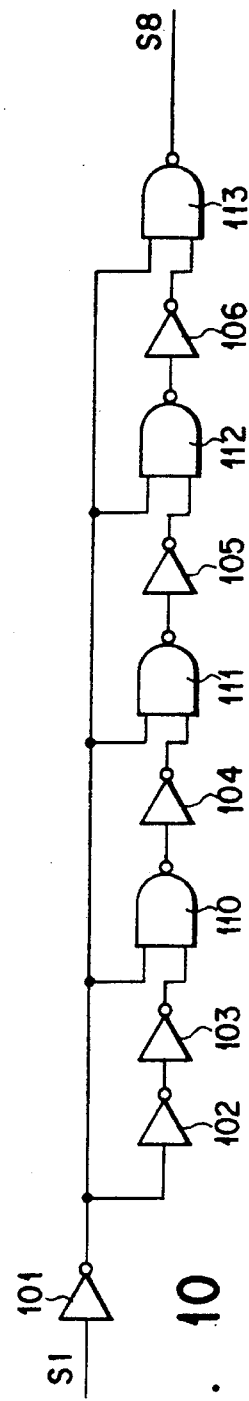
F I G. 10

SEMICONDUCTOR MEMORY DEVICE

BACKGROUND OF THE INVENTION

1. Field of the Invention

The present invention relates to a semiconductor memory device and more particularly to a page mode reading controlling/sense amplifier controller in a semiconductor memory device having a page access mode such as SRAM (static random access memory) and ROM (read only memory).

2. Description of the Related Art

There has been used a semiconductor memory device having a page access mode in which a specific address can be accessed at a high speed. In a reading operation of the page access mode, a page mode column address is changed in a state that a plurality of data of a memory cell array is read up to a sense amplifier in parallel. Thereby, data of the plurality of columns is switched at a high speed to be outputted. Therefore, in the page access mode, though there is a limitation in the point of the random access, a high-speed reading operation can be realized, and this is very useful in the case of reading data in series.

FIG. 1 is a block diagram showing a conventional reading circuit, which is a part of an SRAM having a page access mode.

The SRAM has, for example, a four-bit page access mode. In FIG. 1, reference numeral 10 is a memory cell, 11: a memory cell array, 12: a row decoder for selecting a memory cell to read data of a plurality of memory cells from the memory cell array 11 in accordance with row address A2 to An, 13: a sense amplifier for sensing data read to a pair of I/O,/(I/Oi) lines through a pair of bit lines BLi,/BLi and each column selection circuit 14 from selected plurality of memory cells, 16: a page selection circuit for selecting data outputted from said sense amplifier 13 to a pair of data lines DLi,/DLi, 17: a page decoder for selecting the page selection circuit 16 in accordance with page mode address A0 and A1, and 18: an output buffer for outputting data, which is outputted to a pair of data bus lines BUS,/BUS from the page selection circuit 16, to an output terminal 19.

The following will explain a reading operation of the SRAM of FIG. 1.

In the reading operation in a normal access mode, address signals A0 to An are set, 4-bit data selected by row addresses (normal addresses) A2 to An is read up to the sense amplifier 13 in parallel, and one-bit data is selected in accordance with address signals A0 and A1, and outputted.

In the reading operation in the page access mode, address signals A0 to An are set. On reception of transition of the address signal, 4-bit data (page data) is selected in accordance with row addresses A2 to An, and read up to the sense amplifier 13 in parallel. Then, one-bit data is selected in accordance with the page mode addresses A0 and A1, and outputted.

Then, the page mode address signals A0 and A1 are transited, and the residual 3-bit data is sequentially selected, and sequentially outputted to the output terminal 19 through the output buffer 18, thereby making it possible to perform a high-speed reading.

Moreover, for continuously reading page data, the contents of the row addresses A2 to An is changed, new 4-bit data is selected, and read up to the sense amplifier 13 in parallel. Then, one-bit data is selected in accordance with the page mode addresses A0 and A1, and outputted. Then, the page mode address signals A0 and A1 are transited, and the residual 3-bit data is sequentially selected, and sequentially outputted to the output terminal 19 through the output buffer 18.

In the conventional SRAM reading circuit having a page access mode, since it is needed that the sense amplifier 13 be always activated thereby setting read data in an output state in the page access mode, consumption current of the sense amplifier 13 is high.

SUMMARY OF THE INVENTION

The present invention has been made to solve the problem in that the consumption current of the sense amplifier is high in the read circuit of the convention semiconductor memory device having a page access mode. An object of the present invention is to provide a semiconductor memory device, which can control consumption current of a sense amplifier without activating the sense amplifier in a page access mode.

In order to attain the above object, there is provided a semiconductor memory device comprising memory cells; a memory cell array having the memory cells arranged in a matrix manner; a plurality of sense amplifiers for detecting data read from the plurality of memory cells selected based on a first address input for 10 selecting the plurality of memory cells of the memory cell array; a plurality of latch circuits for latching data from the plurality of the sense amplifiers, respectively; a decode circuit for reading latch data from the plurality of latch circuits to data bus lines through a plurality of data lines based on a second address input corresponding to the plurality of latch circuits; and a control circuit for controlling the sense amplifiers to be activated when only the first address input or both first and second address inputs are changed, and to be inactivated when only the second address input is changed.

For performing the reading operation in the page access mode, the control circuit of the semiconductor memory device of the present invention can control the sense amplifiers to be activated to detect data of the plurality of memory cells selected based on the first address input, and to be inactivated the sense amplifiers after detected data is latched by the latch circuit.

Therefore, according to the semiconductor memory device of the present invention, there is no need that the sense amplifiers are always activated in the page access mode, and the consumption current of the sense amplifiers can be reduced as compared with the conventional case.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing a part of a SRAM of a first embodiment of the present invention;

FIG. 3 is a circuit diagram showing a specific example taking up a pair of a sense amplifier of FIG. 2, a latch circuit, and a page selection circuit;

FIG. 5 is a timing waveform showing an example of an operation of the address transition detecting circuit of FIG. 4 and that of the sense amplifier control circuit;

FIG. 9 is a circuit diagram showing the other example of the address transition detecting circuit and the sense amplifier control circuit of FIG. 4;

FIG. 10 is a circuit diagram showing an example of a delay circuit of FIG. 9;

DETAILED DESCRIPTION OF THE PREFERRED EMBODIMENTS

Figure 1:
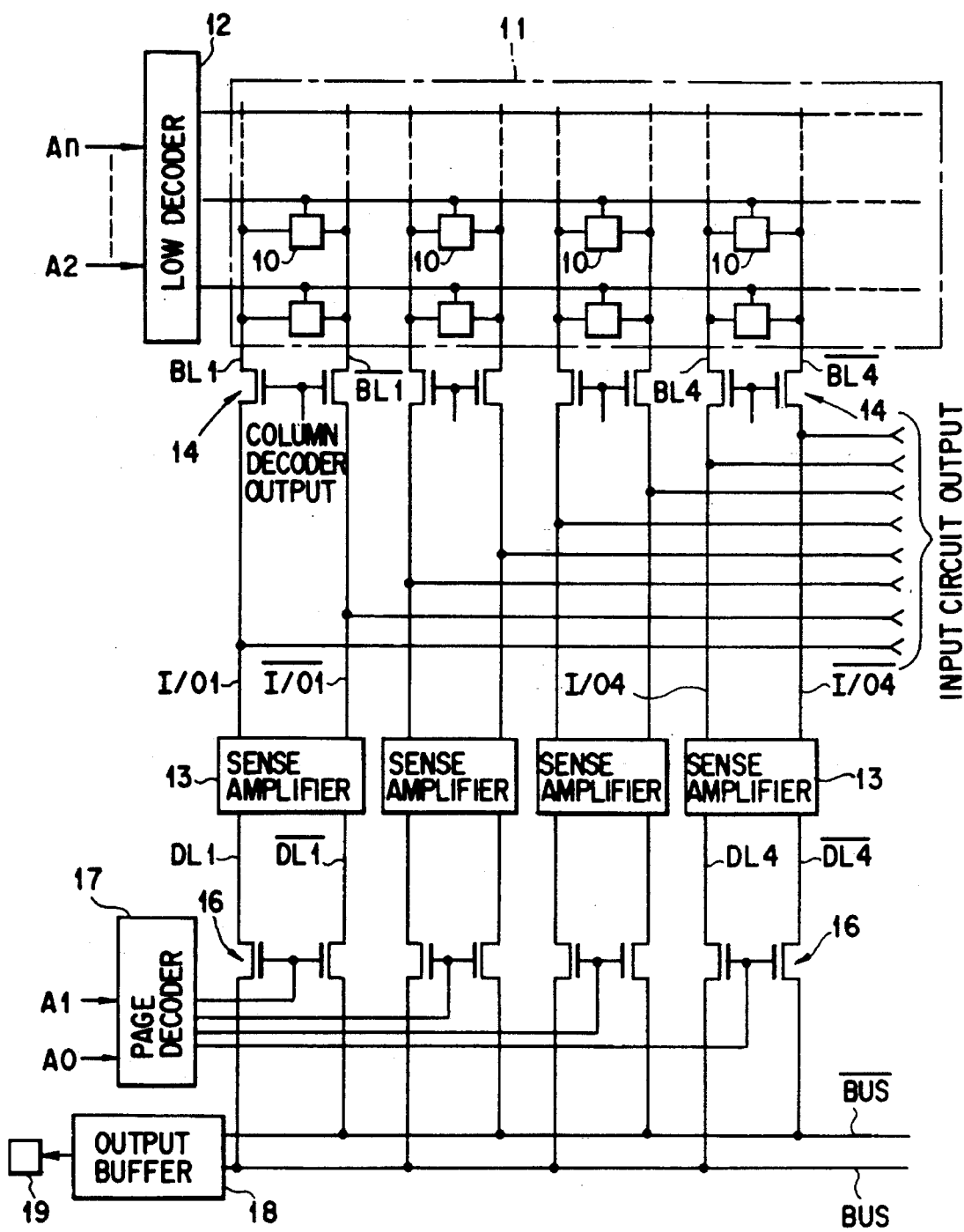
FIG. 1 is a block diagram showing a part of a conventional SRAM.

Embodiments of the present inventions will be explained with reference to the drawings. Since common reference numerals are used in portions common to each other through all drawings, the same explanation is omitted.

FIG. 2 is a block diagram showing a part (read circuit) of a SRAM having a page access mode of a first embodiment of the present invention.

The SRAM has, for example, a four-bit page access mode. In FIG. 2, reference numeral 10 is a memory cell, 11: a memory cell array having the memory cells arranged in a matrix manner, 12: a row decoder for selecting a plurality of the memory cells in accordance with row addresses A2 to An for selecting the plurality of memory cells of the memory cell array, and 13: a plurality of sense amplifiers for detecting data read to each of a pair of I/O lines I/Oi, /(I/Oi) from the plurality of memory cells 10 selected by the row decoder through each of a pair of bit lines BLi, /BLi and each column selection circuit 14.

DLi, /DLi are a pair of data lines for transferring output data of the sense amplifiers 13 to data bus lines BUS, /BUS.

Reference numeral 15 is a plurality of latch circuits for latching data outputted to the pair of data lines DLi, /DLi from the sense amplifiers 13, respectively. Reference numeral 16 is a page selection circuit, which is connected to the pair of the data lines DLi, /DLi in series, for selecting data latched by the latch circuit 15 to be outputted to the data bus lines BUS, /BUS.

Reference numeral 17 is a page decoder for reading latch data from the plurality of latch circuit 15. The page decoder 17 outputs a page decode signal PDi for controlling the page selection circuit 16 in accordance with page mode addresses A0 and A1 corresponding to the plurality of latch circuits 15. Reference numeral 18 is an output buffer for outputting data, which is outputted to the data bus lines BUS, /BUS from the page selection circuit 16, to an output terminal 19.

Moreover, there are provided an address transition detecting circuit 20, and a sense amplifier controlling circuit 30. The address transition detecting circuit 20 generates a pulse signal when the addresses A0 to An is changed. The sense amplifier controlling circuit 30 outputs a sense amplifier controlling signal SE to a sense amplifier control signal line so as to control activation/inactivation of the sense amplifier 13 by use of the pulse signal generated from the address transition detecting circuit 20.

FIG. 3 is a circuit diagram showing a specific example taking up a pair of the sense amplifier 13 of FIG. 2, the latch circuit 15, and the page selection circuit 16.

The sense amplifier 13 comprises CMOS type sense amplifiers 131 and 132 for complementarily detecting data of the pair of the I/O lines I/Oi, /(I/Oi), a MOS transistor T1 for controlling activation/inactivation, which is connected to the sense amplifiers 131 and 132 in common, and is controlled by the sense amplifier control signal SE, a CMOS type sense amplifier 133 to which each of outputs of the sense amplifiers 131 and 132 is inputted, and MOS transistors T2 and T3 for controlling activation/inactivation, which is connected to the sense amplifier 133.

The latch circuit 15 comprises MOS inverters 151 and 152, which are reversely connected between the pair of the data lines DLi, /DLi connected to a pair of output nodes of the sense amplifier 13.

The page selection circuit 16 comprises MOS transistors T4 and T5, which are connected to the pair of the data lines DLi, /DLi in series, respectively, and controlled by a page decode signal PDi from the page decoder 17.

In this embodiment, there are provided four sense amplifiers 13, four latch circuits 15, and four page selection circuits 16 so as to correspond to the page mode address of two bits (A0 and A1) among address signals A0 to An. However, in the case of the page mode addresses of A0 to Ai, there is needed that $2^i$ sense amplifiers 13, $2^i$ latch circuits 15, and $2^i$ page selection circuits 16.

Figure 4:
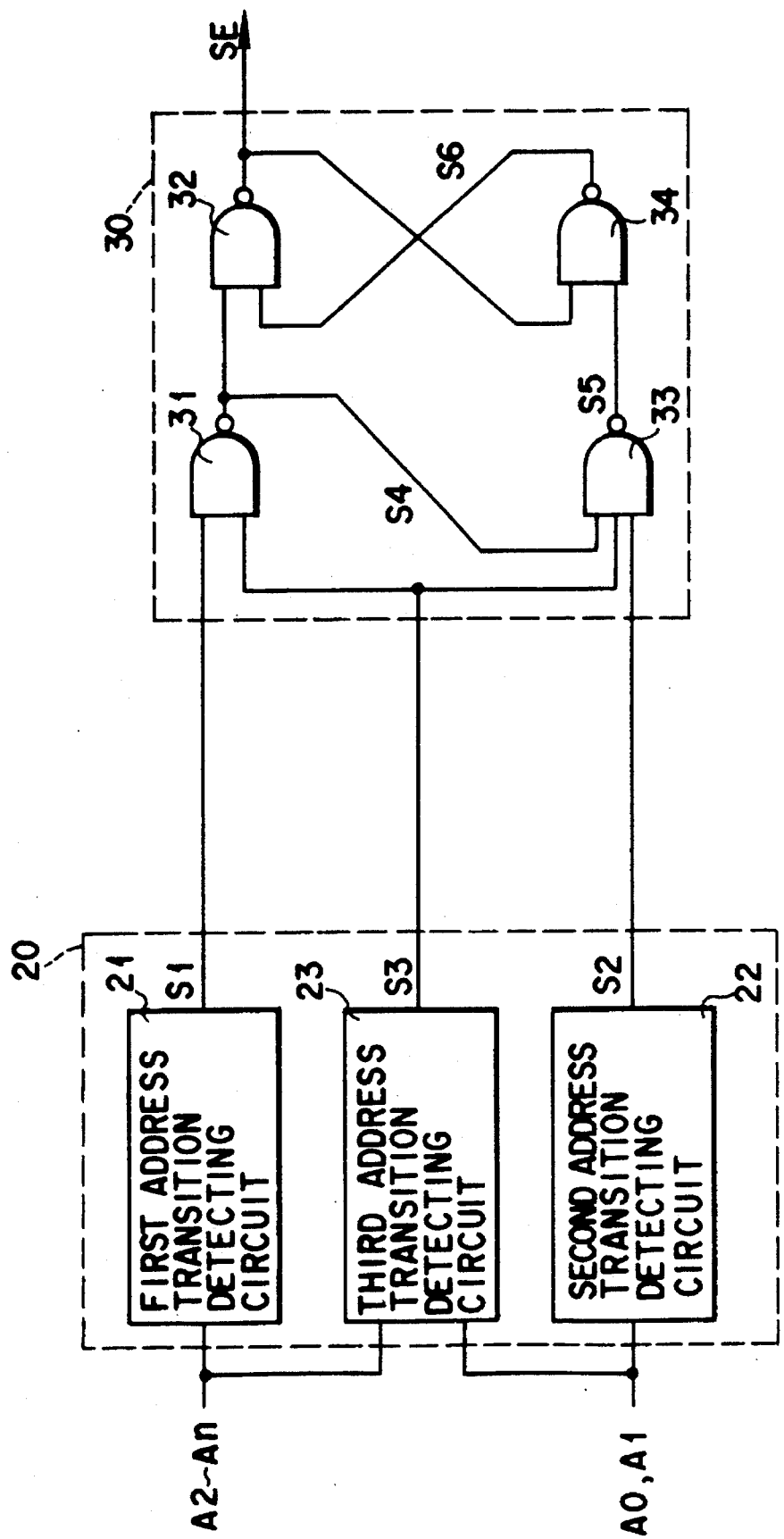
FIG. 4 is a circuit diagram showing an example taking up an address transition detecting circuit of FIG. 2, and a sense amplifier control circuit.

FIG. 4 is a circuit diagram showing an example taking up the address transition detecting circuit 20 of FIG. 2, and the sense amplifier control circuit 30.

In FIG. 4, the address transition detecting circuit 20 comprises a first address transition detecting circuit 21, a second address transition detecting circuit 22, and a third address transition detecting circuit 23. The first address transition detecting circuit 21 generates a first pulse signal S1 when the row addresses A2 to An are changed. The second address transition detecting circuit 22 generates a second pulse signal S2 when the page mode addresses A0 and A1 are changed. The third address transition detecting circuit 23 generates a third pulse signal S3 when either the row addresses A2 to An or page mode addresses A0 and A1 are changed.

Figure 7:
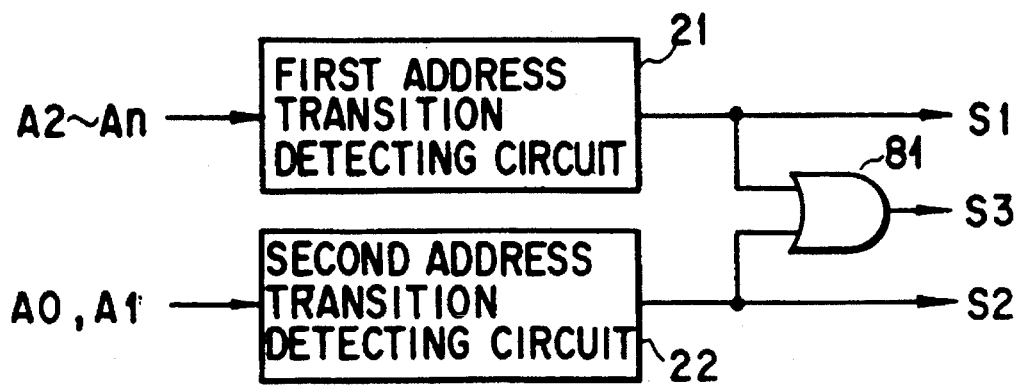
FIG. 7 is a circuit diagram showing a modification of the address transition detecting circuit of FIG. 4.

As shown in FIG. 7, a logic circuit 81, which ORs the first and second pulse signals S1 and S2, may be provided in place of the third address transition detecting circuit 23.

The structure of the address transition detecting circuit, as such, is well known as disclosed in, for example, U.S. Pat. No 4,744,063.

The amplifier controlling circuit 30 of FIG. 4 is structured so as to control the sense amplifier 13 to be activated when only the first address input S1 is changed or the first and second address inputs S1 and S2 are changed, and to be inactivated when only the second address input S2 is changed. For example, the amplifier controlling circuit 30 comprises four NAND circuits 31 to 34.

More specifically, the first pulse signal S1 and the third pulse signal S3 are inputted to the first NAND circuit 31. An output signal S4 of the first NAND circuit 31 and an output signal S6 of the fourth NAND circuit 34 are inputted to the second NAND circuit 32. An output signal S4 of the first NAND circuit 31 and the second and third pulse signals S2 and S3 are inputted to the third NAND circuit 33. An output signal S5 of the third NAND circuit 33 and an output signal (sense amplifier control signal output SE) of the second NAND circuit 32 are inputted to the fourth NAND circuit 34.

The following will explain an operation of the address transition detecting circuit 20 of FIG. 4 and that of the sense amplifier controlling circuit 30 with reference to the timing waveform shown in FIG. 5.

When the row addresses A2 to An and the page mode addresses A0 and A1 are transited at the same time, the first pulse signal S1, which is sent from the first address transition detecting circuit 21, the second pulse signal S2, which is sent from the second address transition detecting circuit 22 and the third pulse signal S3, which is sent from the third address transition detecting circuit 23, are activated. Thereby, the control signal output SE of the sense amplifier controlling circuit 30 is set to be "H" level, and the sense amplifier 13 is activated.

When only the page mode addresses A0 and A1 are transited, the second pulse signal S2, which is sent from the second address transition detecting circuit 22, and the third pulse signal S3, which is sent from the third address transition detecting circuit 23, are activated. However, the first pulse signal S1 is not activated. Thereby, the control signal output SE of the sense amplifier controlling circuit 30 is controlled to be set to "L" level, and the sense amplifier 13 is inactivated.

Also, when only the row addresses A2 to An are transited, the first pulse signal S1, which is sent from the first address transition detecting circuit 21, and the third pulse signal S3, which is sent from the third address transition detecting circuit 23, are activated. However, the second pulse signal S2 is not activated. Thereby, the control signal output SE of the sense amplifier controlling circuit 30 is set to "H" level again, and the sense amplifier 13 is activated.

A reading operation of the SRAM of FIG. 2 will be explained with reference to the timing waveform of FIG. 5.

For reading data in the normal access mode, address signals A0 to An are set, and 4-bit data selected by the row addresses (normal addresses) A2 to An is read up to the sense amplifier 13 in parallel. In this case, only the row addresses A2 to An are transited, so that only the pulse signal S1 is generated. Or, both the row addresses A2 to An and the page mode addresses A0 and A1 are transited, so that pulse signals S1 and S3 are generated, and the sense amplifier controlling circuit 30 controls the sense amplifier 13 to be activated.

As a result, 4-bit data is detected by the sense amplifier 13, detected data is latched by the latch circuit 15, and one bit data among latched data is selected and outputted in accordance with the address signals A0 and A1 among the address signals A0 to An.

For reading data in the page access mode, address signals A0 to An are set, on reception of the transition of the address signal, 4-bit data (page data) is selected in accordance with row addresses A2 to An, and read up to the sense amplifier 13 in parallel. In this case, since only the row addresses A2 to An are transited, the pulse signals S1 and S3 are generated, and the sense amplifier controlling circuit 30 controls the sense amplifier 13 to be activated.

Thereby, page data is detected by the sense amplifier 13, detected page data is latched by the latch circuit 15, and one bit data among latched data is selected and outputted in accordance with page mode addresses A0 and A1.

Thereafter, when only the page mode addresses A0 and A1 are transited, the pulse signals S2 and S3 are generated, the sense amplifier controlling circuit 30 controls the sense amplifier 13 to be inactivated, and page data, which is latched by the latch circuit 15, can be sequentially selected and outputted in accordance with the page mode address signals A0 and A1.

Thereby, the high speed reading can be performed in selecting the page address, and the consumption current of the sense amplifier 13 can be reduced as compared with the conventional case.

Moreover, for continuously reading page data, if only the row addresses A2 to An or the row addresses A2 to An and page addresses A0 and A1 are transited, the sense amplifier controlling circuit 30 controls the sense amplifier 13 to be activated. Thereby, data of the pair of I/O lines I/Oi, /(I/Oi) is detected by the sense amplifier 13, and detected page data is latched by the latch circuit 15. Due to this, data reading can be performed in the page access mode.

As mentioned above, according to the SRAM of FIG. 2, when only the first address input or the first and second address inputs are changed, the sense amplifier is controlled to be activated. Then, when only the second address input is changed, the sense amplifier is controlled to be inactivated.

Thereby, for performing the reading operation in the page access mode, the sense amplifier can be controlled to be activated in order to detect data of the plurality of memory cells selected based on the first address input. Moreover, after detected data is latched by the latch circuit, the sense amplifier can be controlled to be inactivated.

Therefore, according to the semiconductor memory device of the present invention, there is no need that the sense amplifiers are always activated in the page access mode, and the consumption current of the sense amplifiers can be reduced as compared with the conventional case.

By the way, as the memory chip is increased in size, a parasitic capacity C of the data bus lines BUS, /BUS and a resistance component R are also increased. In the case that CR of the data bus lines BUS,/BUS is large, the page selection circuit 16 is turned on, and the latch circuit 15 is connected to the data bus lines BUS, /BUS. At this time, if data of the data line DLi, DLi, which the latch circuit 15 will latch, is different from data of the data bus line BUS, /BUS, the input level of the latch circuit 15 becomes unstable by influence of data of the data bus lines BUS, /BUS, and the latch circuit 15 cannot correctly latch data, so that there is possibility that correct data cannot be read.

Figure 6:
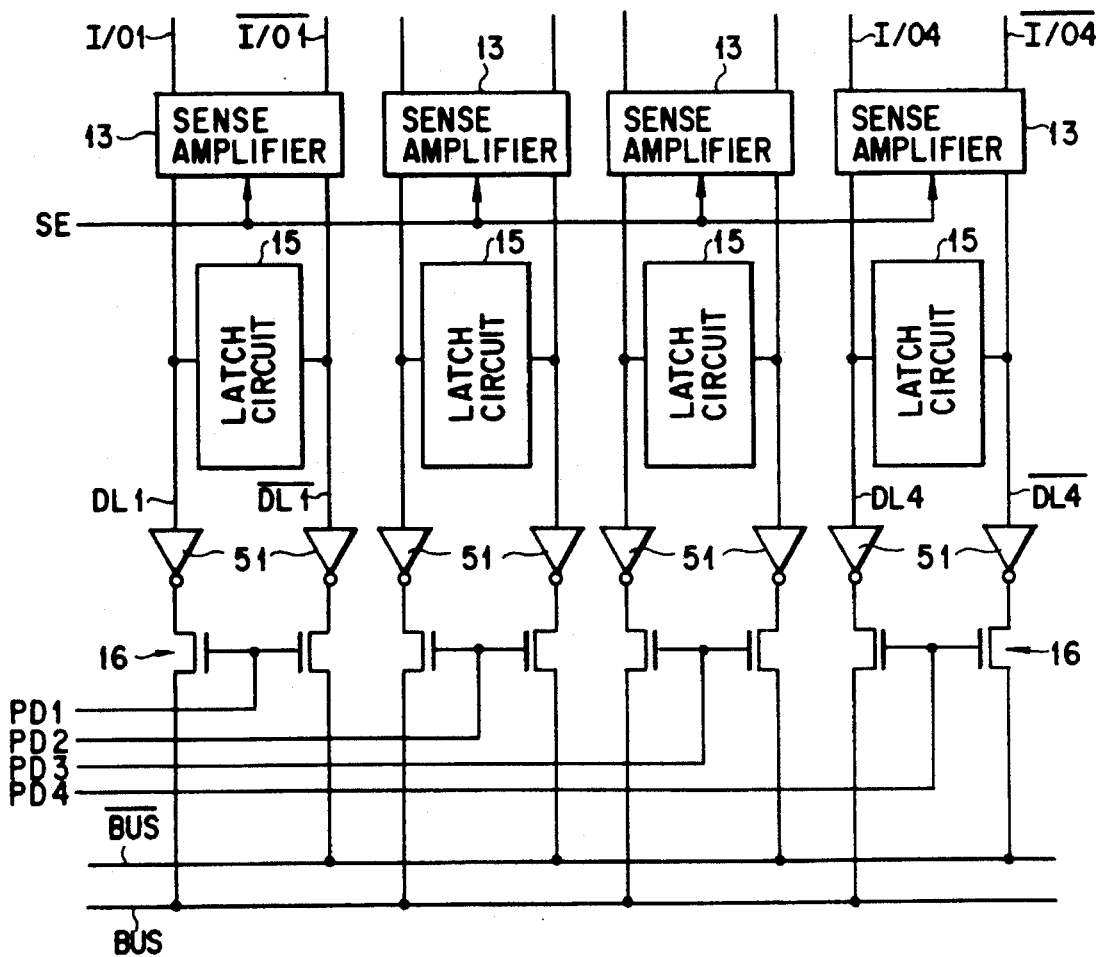
FIG. 6 is a block diagram showing a circuit provided between the latch circuit and a data bus line of a second embodiment of the present invention.

In order to solve the problem in which the input level of the latch circuit 15 becomes unstable by influence of data of the data bus lines BUS, /BUS in SRAM of FIG. 2, a buffer circuit may be connected in series to the page selection circuit 16, which is connected to each of data lines DLi, /DLi formed between the latch circuit 15 and the data bus lines BUS, /BUS as shown in FIG. 6.

More specifically, in FIG. 6, a MOS inverter 51, serving as a buffer circuit, is connected between the latch circuit 15 and the page selection circuit 16. In FIG. 6, the same reference numerals as FIG. 2 are added to the same portions as FIG. 2.

By use of the circuit shown in FIG. 6, when the the page selection circuit 16 is turned on and the latch circuit 15 and the data bus lines BUS, /BUS are connected, data of the data bus lines BUS, /BUS is not transmitted to the latch circuit 15 due to the inverter 51. As a result, the input level of the latch circuit 15 is not subjected to the influence of data of the data bus lines BUS, /BUS, the latch circuit 15 can correctly latch data, and correct data can be read.

Figure 8:
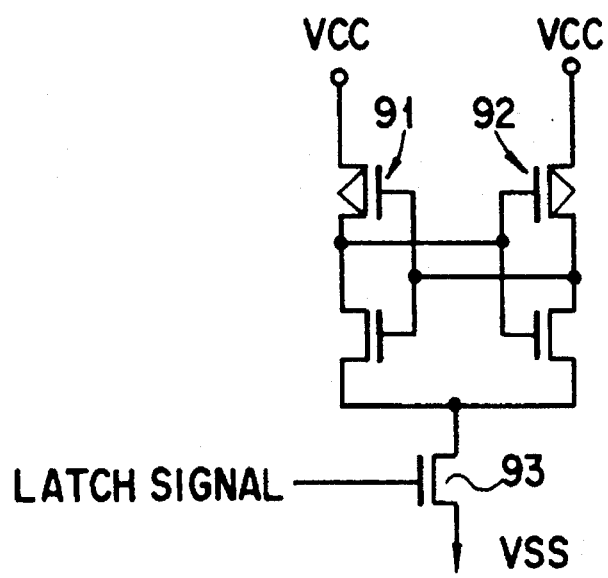
FIG. 8 is a circuit diagram showing a modification of the latch circuit of FIG. 3.

In the above-mentioned embodiments, the latch circuit 15 may be a static latch circuit, and FIG. 8 shows one example of the structure of the static latch circuit, which is controlled by a latch control signal.

In the latch circuit of FIG. 8, CMOS inverters 91 and 92 are inversely connected to each other, an NMOS transistor 93 for a latch control is connected between a low voltage side power source node of the CMOS inverters 91 and 92 and a ground node thereof, and the latch control signal is supplied to the gate of the NMOS transistor 93.

The present invention is not limited to the above-mentioned SRAM. The present invention can be applied to the other semiconductor memory having a page access mode.

The above embodiment explained the case in which the consumption current of the sense amplifier is controlled in the page access mode. The following will explain the other embodiment for controlling the consumption current of the sense amplifier in the normal mode.

FIG. 9 is a circuit diagram showing the other example of the sense amplifier control circuit of FIG. 4 together with the address transition detecting circuit 20. A sense amplifier controlling circuit of FIG. 9 comprises a delay circuit 91 for inputting the first pulse signal S1 thereto, and delaying the tailing edge of the the pulse signal for a predetermined period of time to be outputted, and a logic circuit (for example, a NAND circuit 92 and an inverter 93) for obtaining an AND of the output signal S8 of the delay circuit 91 and the output signal S7 of the sense amplifier controlling circuit 30 so as to generate a signal SE for controlling the sense amplifier, in addition to the sense amplifier controlling circuit 30 for generating the output signal S7, which is activated when it is detected that the first pulse signal S1 of the output signals of the address transition detecting circuit 20 is activated, and which is inactivated when it is detected that the second pulse signal S2 of the output signals of the address transition detecting circuit 20. FIG. 10 is a circuit diagram showing an example of the delay circuit 91 of FIG. 9. In FIG. reference numerals 101 to 106 are inverter circuits, and 110 to 113 are NAND circuits.

Figure 12:
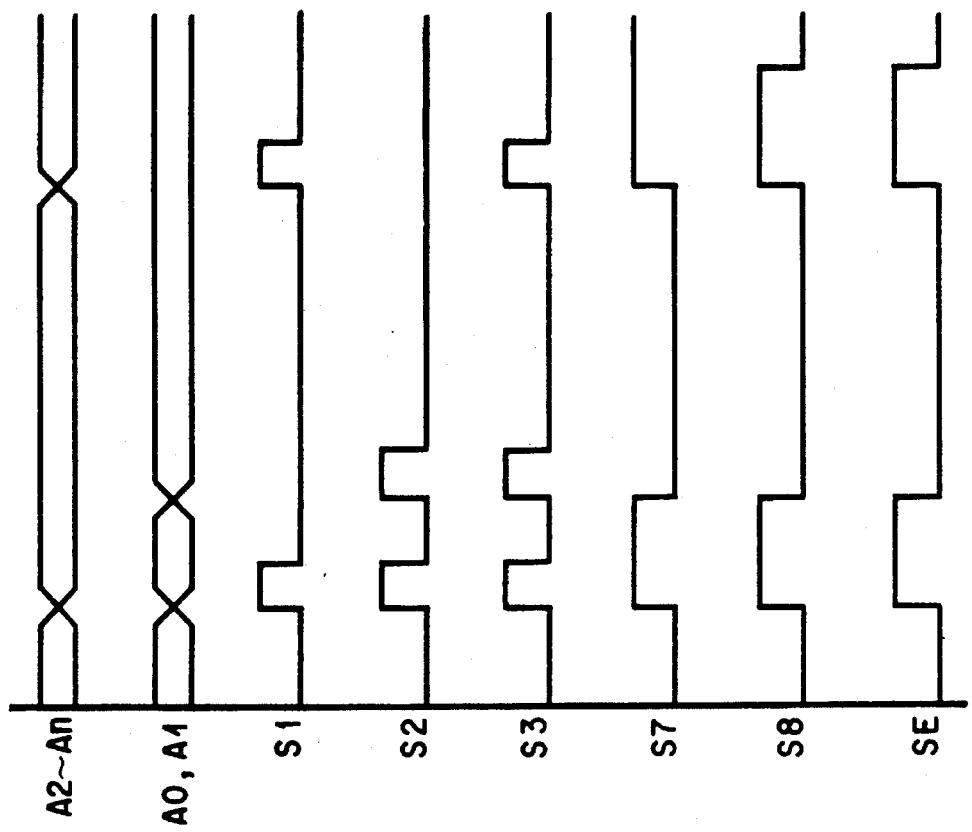
FIG. 12 is a timing waveform showing the other operation of the circuit of FIG. 9.
Figure 11:
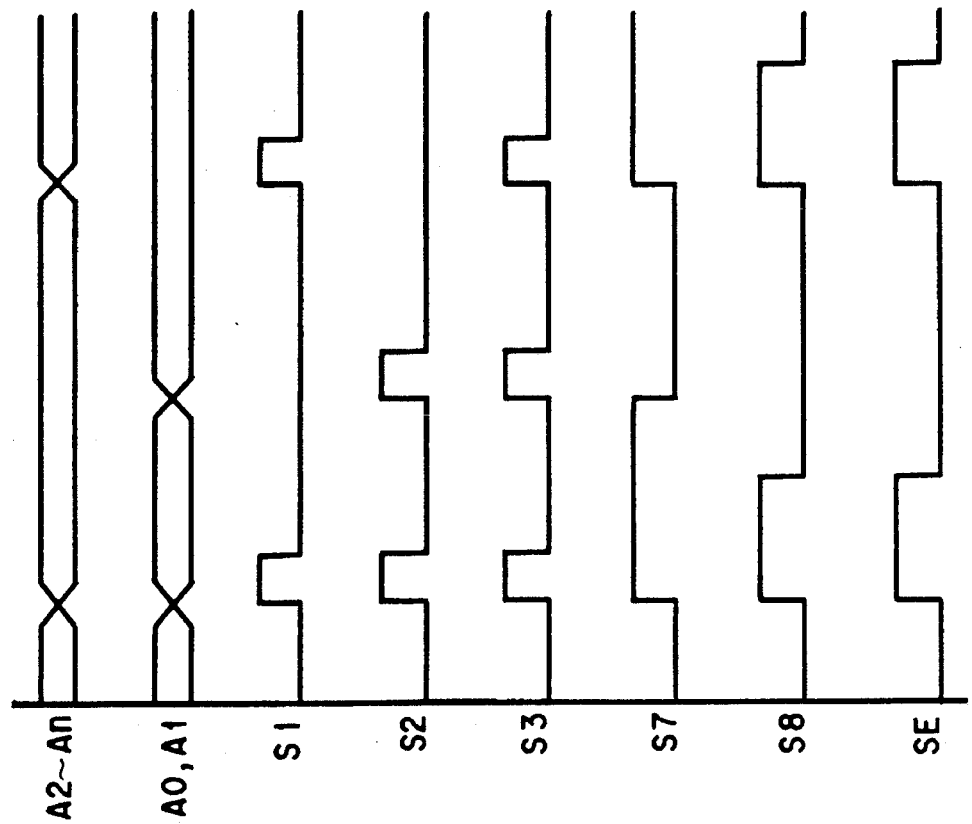
FIG. 11 is a timing waveform showing one operation of the circuit of FIG. 9.

FIG. 11 shows an example of an operation in which the period of time, which is from the time after the pulse width of the output signal S8 of the delay circuit 91 or the normal addresses are changed till the page mode addresses A0 to A1 are changed, is long, and FIG. 12 shows an example of an operation in which such a period of time is short.

In other words, when it is detected that the first pulse signal S1 is activated by the transition of the normal addresses A2 to An, the signal SE is in an "H" level, and the sense amplifier controlling circuit of FIG. 9 controls such that the sense amplifier is set to be in the active state. In this case, the period of time of the "H" level of the signal SE is limited for a fixed period of time (from the time after the pulse width of the output signal S8 of the delay circuit 91 or the normal addresses are changed till the page mode addresses A0 and A1 are changed).

In contrast, when it is detected that the second pulse signal S2 is activated by the transition of the page mode addresses A0 and A1, similar to the operation of the sense amplifier controlling circuit 30 of FIG. 4, the signal SE is in an "L" level, and the sense amplifier is controlled to be set to be in the inactive state.

Therefore, similar to FIG. 6, in the SRAM using the circuit of FIG. 9, the buffer circuit (for example, MOS inverter circuit) can be connected between the latch circuit 15 and the page selection circuit 16.

The embodiments specifically shown by the specification and drawings are not limited to the present invention. Various modifications can be made within the gist of the present invention and the claims of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device, comprising: memory cells;

a memory cell array having the memory cells arranged in a matrix manner;

a plurality of sense amplifiers for detecting data read from the plurality of memory cells selected based on a first address input for selecting the plurality of memory cells of the memory cell array;

a plurality of latch circuits for latching data from the plurality of the sense amplifiers, respectively;

a decode circuit for reading latch data from the plurality of latch circuits to data bus lines through a plurality of data lines based on a second address input corresponding to the plurality of latch circuits; and a control circuit for controlling said sense amplifiers to be activated when only said first address input or both said first and second address inputs are changed, and to be inactivated when only said second address input is changed.

2. The semiconductor memory device according to claim 1, wherein said control circuit comprises:

an address transition detecting circuit for generating first and third pulse signals when said first address input is changed, and generating second and third pulse signals when said second address input is changed; and a sense amplifier controlling circuit for controlling activation/inactivation of said sense amplifier based on an output signal of said address transition detecting circuit.

3. The semiconductor memory device according to claim 2, wherein said address transition detecting circuit comprises:

a first address transition detecting circuit for generating the first pulse signal when said first address input is changed;

a second address transition detecting circuit for generating the second pulse signal when said second address input is changed; and a third address transition detecting circuit for generating the third pulse signal when either said first address input or said second address input is changed.

4. The semiconductor memory device according to claim 2, wherein said address transition detecting circuit comprises:

a first address transition detecting circuit for generating the first pulse signal when said first address input is changed;

a second address transition detecting circuit for generating the second pulse signal when said second address input is changed; and a logic circuit for ORing said first and second pulse signals to generate said third pulse signal.

5. The semiconductor memory device according to claim 2, wherein said sense amplifier control circuit activates said sense amplifier when said sense amplifier control circuit detects that only first and third pulse signals of the output signals of said address transition detecting circuit are activated;

said sense amplifier control circuit activates said sense amplifier when said sense amplifier control circuit detects that all output signals of said address transition detecting circuit are activated; and said sense amplifier control circuit controls said sense amplifier to an inactive state when said sense amplifier control circuit detects that only second and third pulse signals of the output signals of said address transition detecting circuit are activated.

6. The semiconductor memory device according to claim 2, wherein said sense amplifier controlling circuit controls said sense amplifier to be activated for a fixed period of time when it is detected that the first pulse signal of the output signals of said address transition detecting circuit is activated, and to be inactivated when it is detected that the second pulse signal of the output signals of said address transition detecting circuit is activated.

7. The semiconductor memory device according to claim 6, wherein said sense amplifier controlling circuit comprises:

a first circuit for generating an output signal, which is activated when it is detected that the first pulse signal of the output signals of said address transition detecting circuit is activated, and which is inactivated when it is detected that the second pulse signal of the output signals of said address transition detecting circuit;

a delay circuit for inputting said first pulse signal thereto, and delaying the tailing edge of the the pulse signal for a predetermined period of time to be outputted; and a logic circuit for obtaining an AND of the output signal of said delay circuit and the output signal of said first circuit to to generate a signal for controlling said sense amplifier.

8. The semiconductor memory device according to any one of claims 1 to 7, wherein said decode circuit comprises:

a plurality of MOS transistors for page selection inserted to said plurality of data lines, respectively;

a page decoder for outputting a page decode signal to control said MOS transistors for page selection in accordance with said second address input; and a plurality of buffer circuits inserted to said plurality of said data lines, respectively, and connected to said MOS transistors for page selection in series.

* * * * *